United States Patent
Hinterberger et al.

(10) Patent No.: US 11,233,298 B2
(45) Date of Patent: Jan. 25, 2022

(54) PROTECTIVE DEVICE, BATTERY, MOTOR VEHICLE, AND METHOD FOR SWITCHING OFF A BATTERY CELL

(71) Applicant: AUDI AG, Ingolstadt (DE)

(72) Inventors: Michael Hinterberger, Großmehring (DE); Berthold Hellenthal, Schwanstetten (DE); Peter Pilgram, Neuburg an der Donau (DE)

(73) Assignee: AUDI AG, Ingolstadt (DE)

( * ) Notice: Subject to any disclaimer, the term of this patent is extended or adjusted under 35 U.S.C. 154(b) by 123 days.

(21) Appl. No.: 16/782,345

(22) Filed: Feb. 5, 2020

(65) Prior Publication Data

US 2020/0266417 A1 Aug. 20, 2020

(30) Foreign Application Priority Data

Feb. 19, 2019 (DE) ..................... 10 2019 202 164.6

(51) Int. Cl.
*H01M 10/42* (2006.01)
*H01M 50/572* (2021.01)

(52) U.S. Cl.
CPC ..... *H01M 50/572* (2021.01); *H01M 10/4257* (2013.01); *H01M 2010/4271* (2013.01); *H01M 2220/20* (2013.01)

(58) Field of Classification Search
CPC ............ G01R 31/364; H01M 10/4257; H01M 10/4285; H01M 10/48; H01M 10/613; H01M 2010/4271; H01M 2200/00; H01M 2220/20; H01M 50/572; Y02E 60/10
See application file for complete search history.

(56) References Cited

U.S. PATENT DOCUMENTS

2009/0146614 A1 6/2009 Carrier et al.
2012/0064378 A1 3/2012 Wang et al.

FOREIGN PATENT DOCUMENTS

| DE | 10 2011 079 292 A1 | 1/2013 |
| DE | 10 2013 214 726 A1 | 1/2015 |
| EP | 2 272 722 B1 | 4/2015 |
| WO | 2017/025756 A1 | 2/2017 |
| WO | 2018/142139 A1 | 8/2018 |

OTHER PUBLICATIONS

Examination Report dated Dec. 19, 2019 in corresponding German application No. 10 2019 202 164.6; 16 pages including Machine-generated English-language translation.

*Primary Examiner* — Victoria H Lynch
(74) *Attorney, Agent, or Firm* — Maier & Maier, PLLC (57) ABSTRACT

A protective device for switching off a battery cell of a motor vehicle battery in the event of an electrical short-circuit. The battery cell has two cell terminals and an energy storage unit for storing energy. The energy storage unit is connected to the cell terminals in an electrically conductive manner in order to provide cell voltage to the cell terminals. The protective device detects the short-circuit as a function of at least the cell voltage affecting the battery cell. In this case, the battery cell has the protective device and at least one switching device, which is arranged between the energy storage unit and at least one of the cell terminals. The protective device isolates the energy storage unit from the at least one of the cell terminals in order to switch off the battery cell by the switching device.

9 Claims, 3 Drawing Sheets

PROTECTIVE DEVICE, BATTERY, MOTOR VEHICLE, AND METHOD FOR SWITCHING OFF A BATTERY CELL

FIELD

The invention relates to a protective device for switching off a battery cell of a battery of a motor vehicle in the event of an electrical short-circuit. In this case, the battery cell has two cell terminals and an energy storage unit for storing energy, wherein the energy storage unit is connected to the cell terminals in an electrically conductive manner, at least in a certain operating state of the battery cell, in order to provide cell voltage to the cell terminals. Furthermore, the protective device is designed to detect the short-circuit as a function of at least the cell voltage affecting the battery cell. The invention also includes a battery, particularly a high-voltage battery, for a motor vehicle having such a protective device, a motor vehicle having such a battery, as well as a method for switching off a battery cell.

BACKGROUND

Motor vehicles, particularly electric vehicles, are known from the prior art which have a battery, particularly a high-voltage battery which is designed, as an energy storage device, to provide a very high voltage, typically in the range between an ongoing 400 V and 800 V. Due to these high voltages, monitoring of such a battery system is of central importance as is the fastest possible introduction of responses to detected faults such as, for example, detected short-circuits.

In this context, DE 10 2013 214 726 A1 describes an arrangement for electrically safeguarding a first operating state in a supply network with a variable internal source resistance, determined by the system, of an energy source, which may be designed as a high-voltage battery, wherein the arrangement comprises, on the one hand, a first safety device such as, for example, a fuse, the response characteristics of which are not sufficient for safeguarding the supply network in the first operating state against a pre-defined load, as well as a second safety device, which can safeguard the supply network against the load. The second safety device in this case may comprise a low-voltage cut-off for the high-voltage battery, which is designed such that, upon detection of low voltage, the main contactors, by means of which the high-voltage battery is coupled to the vehicle's remaining electrical system, are opened and thereby the high-voltage battery is switched off.

Furthermore, DE 10 2011 079 292 A1 describes a battery management system with a control device and one or more cell-monitoring units to monitor several battery cells, respectively, of at least one battery module of a battery, wherein the cell-monitoring units each have a microcontroller, which is connected to the control device by means of a communication connection. Furthermore, a measuring electronics system is provided for detecting one or more measured variables from the battery cells and, to this end, has means for detecting current and voltage. Furthermore, the microcontroller is designed, to this end, to calculate a state of charge.

Furthermore, WO 2018/142139 A1 describes an intelligent battery cell, which has a positive terminal and a negative terminal and a circuit, which is designed to switch between a first switching state, in which an energy storage device is connected to the positive terminal and the negative terminal, and a second switching state, in which the energy storage device is bypassed. Furthermore, the intelligent cell has inductance between the positive terminal and an output of the combinational circuit, wherein a control unit monitors a voltage dropping via inductance and controls the duty cycle of the circuit based on the variable of a detected voltage change via inductance. Based on this, the control unit can determined a state of charge of other intelligent battery cells connected in series without any sort of communication between the cells.

SUMMARY

The object of the present invention is to provide a protective device, a battery, a motor vehicle, and a method for switching off a battery cell, which make it possible to further increase the safety of a battery.

Said object is achieved by means of a protective device, a battery, a motor vehicle, and a method.

With a protective device according to the invention for switching off a battery cell of a battery of a motor vehicle in the event of an electrical short-circuit, the battery cell has two cell terminals and an energy storage unit to store energy. In doing so, the energy storage unit is connected to the cell terminals in an electrically conductive manner, in a certain operating state of the battery cell, in order to provide cell voltage to the cell terminals. Moreover, the protective device is designed to detect the short-circuit as a function of at least the cell voltage affecting the battery cell. Furthermore, the battery cell has the protective device, as well as at least one switching device, which is arranged between the energy storage unit and at least one of the cell terminals, wherein the protective device is designed to isolate the energy storage unit from at least one of the cell terminals by means of the switching device.

A safety switch-off in the event of a detected short-circuit cannot only be advantageously implemented by the invention at the battery level or battery module level but even at the cell level of respective individual cells of the battery. In addition, such an electrical short-circuit in this case can be detected in an especially simple and reliable manner based on a cell voltage dropping via an individual energy storage unit of the battery cell, which simultaneously provides advantages in several respects. On the one hand, so-called smart cells and/or intelligent battery cells exist, which may have their own control unit assigned to them, such as, for example, a microcontroller, and in which one or more switching elements may also be integrated. Moreover, such intelligent battery cells may also comprise various sensors such as, for example, voltage and/or current sensors, such that, based on such an intelligent battery cell, the protective device according to the invention can be implemented in an especially simple and economical manner, because, for detecting short-circuits, sensors installed in such an intelligent cell are used, particularly at least one sensor which can be used to determine a voltage dropping via the energy storage unit, as well as also the integrated switching device in order to isolate the energy storage unit from at least one of the cell terminals in the event of a detected short-circuit. In order to actuate the at least one switching device, the protective device may have, for example, a control unit, which is likewise integrated into the battery cell, and which may be provided, for example, by a microcontroller, which, as described, can likewise be found in such intelligent cells. Alternatively, such a control unit may also be designed as an analog circuit. Such an analog circuit may have, for example, a comparator, which compares a cell voltage signal, as an input signal, to a defined voltage threshold value and generates an output signal as a function of the result of the comparison, as a function of which the at least one switching device is controlled. A further great advantage of using the individual cell voltage for short-circuit detection additionally exists in that both cell-internal and cell-external short-circuits can hereby be detected and that also, for example, limit values, which will be explained in greater detail in the following, can be selected specific to the cell such that the reliability of the short-circuit detection and thus the safety of the battery can hereby be further increased. An especially great advantage of the invention, however, specifically exists in that a safety switch-off can be carried off significantly quicker than with the previous designs, which thereby implement a switch-off of a battery cell in that the main contactors of the entire high-voltage battery are opened. The reason for this is that the switching device for isolating the energy storage unit of the battery cell from the at least one cell terminal of the battery cell can be designed for significantly lower current strengths than a high-voltage contactor of a high-voltage battery such that the switching device can be designed as an electronically controllable switch, whereby significantly shorter closing and opening times can be provided, particularly within the millisecond range or less. A power switch-off can thus be provided on the whole significantly quicker also than with the previous designs and thereby further increase the safety of a battery.

The energy storage unit of the battery cell in this case may be, for example, a galvanic element, particularly a galvanic cell. Such a galvanic element may be housed together with the described protective device, including the at least one switching device and particularly at least one sensor, as is described in more detail in the following, in a common cell housing. In this manner, an intelligent battery cell can be provided with voltage-based short-circuit detection and correspondingly resulting safety switch-off in an especially compact manner. To this end, the protective device, as described, may comprise a control unit, for example in the form of a microcontroller, which may then likewise be situated in the cell housing. The at least one switching device is preferably designed as an electronically controllable switch such as, for example, as a MOSFET (Metal Oxide Field-Effect Transistor). The cell terminals of the battery cell in this case comprise a positive terminal and a negative terminal. The at least one switching device may then be arranged, for example, between the energy storage unit and the positive terminal of the battery cell or even between the energy storage unit and the negative terminal of the battery cell. The battery cell, however, may also have two such switching devices, namely one between the energy storage unit and the positive terminal and one further between the energy storage unit and the negative terminal. In such a case, in the event of a short-circuit detection, either the one or the other switching device for isolating the energy storage unit is actuated either by the positive terminal or by the negative terminal and/or the corresponding switch is opened, or both switching devices can also be actuated, and thus there is an isolation of the connection of the energy storage unit from both the positive terminal and the negative terminal. An even higher degree of safety can hereby be provided.

The at least one operating state of the battery cell, in which the energy storage unit is connected to the cell terminals in an electrically conductive manner, i.e. the at least one switching device is closed, may constitute in this case a certain fault-free state and/or a state conforming to operation, in which at least no short-circuit has been detected, and preferably as well no other fault case different from a short-circuit has been detected, particularly for which a decoupling of the energy storage unit from at least one of the cell terminals is advantageous and/or provided.

With an advantageous embodiment of the invention, the protective device detecting the short-circuit is designed for detecting the cell voltage affecting the battery cell as a voltage dropping via the energy storage unit. The detection of the voltage dropping directly via the energy storage unit of the battery cell for short-circuit detection has the advantage, for example in contrast to the detection of the voltage dropping via the entire battery cell, particularly via the cell terminals thereof, that voltage detection is also possible when the energy storage unit is decoupled from the cell terminals or at least from one of the cell terminals, for example, via the at least one switching device. For example, a suitable sensor for detecting the voltage dropping via the energy storage unit may be arranged thus within the battery cell, even in the case that the energy storage unit is decoupled from one or even from both cell terminals via the at least one switching device, and detection of the voltage dropping via the energy storage unit is still possible. It can also thereby be determined, for example, whether an opening of the at least one switching device interrupts the short-circuit and the resulting short-circuit current or not. In this manner, there may also be differentiation, for example, as to whether the detected short-circuit is an internal short-circuit or an external short-circuit. If it is an external short-circuit, the energy storage unit can thus be decoupled from at least one of the cell terminals and also from the influence of this external short-circuit by means of opening the switching device and the resulting decoupling, and the cell voltage, which is dropping via the energy storage unit, would then in turn normalize. If this is not the case, then this is an internal short-circuit, which can be caused, for example, by a particle between the films of the galvanic element. In this manner, even significantly more differentiated assessments are thus possible with respect to short-circuit detection.

It is especially advantageous in this case when the protective device for detecting the cell voltage has a voltage sensor, which is connected to the cell terminals in parallel and to the energy storage unit in parallel. Essentially, the voltage dropping via the energy storage unit may also be determined as a function of a current measurement, for example by means of a current sensor, of the current flowing through the energy storage unit; the direct detection of the voltage by means of a voltage sensor connected to an energy storage unit in parallel, however, is significantly simpler and also more precise with respect to the detected voltage. The taps of this voltage sensor in this case are thus arranged between the energy storage unit and a respective cell terminal of the battery cell, and that is preferably such that at least one of the taps is arranged between the energy storage unit and the at least one switching device. If the battery cell has two switching devices, one between a respective cell terminal and the energy storage unit, it is thus preferable for both taps of the voltage sensor to be arranged between the energy storage unit and a respective switching device. A voltage dropping via the energy storage unit can thereby also still be detected, as previously described, when one or both switching devices are open.

With an especially advantageous embodiment of the invention, the protective device is designed to detect the short-circuit under the at least one condition that the detected cell voltage fails to meet a definable minimum voltage limit value and/or that a detected change in the cell voltage over time exceeds a definable gradient value. This is based on the idea that a short-circuit or at least a strong current flow through the battery cell causes a characteristic voltage drop, which can advantageously be used for short-circuit detection. In this case, a short-circuit is considered then to be detected when the detected cell voltage fails to meet a definable minimum voltage limit value or when a detected change in cell voltage over time fails to meet a definable minimum gradient limit value, or only when both occur. Both the size of the voltage drop itself as well as the gradient of voltage over time are advantageous variatiles, based on which a short-circuit can be detected with a high degree of reliability. In particular, a short-circuit is expressed significantly differently in these variables than an operating state, for example, with high performance demand such as, for example, in a boost mode or a strong acceleration. Thus, based on the aforementioned variables, particularly at least one of the aforementioned variables, reliable detection of a short-circuit can be provided, on the one hand, and, on the other hand, a reliable differentiation between short-circuit and boost mode and/or acceleration mode can also be provided. In order to detect the short-circuit in this described manner, the protective device may, in turn, have a microcontroller or even an analog circuit. In order to check whether the change in cell voltage over time exceeds a certain gradient limit value, the analog circuit, for example, may be a differentiator, i.e. an operation-boosting differentiation circuit, which generates an output signal which is the first derivation of the input signal, which is the cell voltage here. The output signal thus represents the change in cell voltage over time. This can be provided as an input signal to a comparator, which compares this input signal with the defined gradient limit value and provides an output signal as a function of the result of the comparison, as a function of which the at least one switching device is actuated. In order to check whether the detected cell voltage fails to meet a definable minimum voltage limit value, an analog circuit can likewise be used, particularly a comparator, which compares a cell voltage signal as an input signal with a defined voltage threshold value and generates an output signal as a function of the result of the comparison, as a function of which the at least one switching device can be controlled.

The change in voltage over time may be provided, for example, by means of detection multiple repeated times, particularly a continual detection of the voltage dropping via the energy storage unit. In other words, the aforementioned voltage sensor may likewise be used to detect the change in voltage over time. Short-circuit detection can be provided especially quickly and reliably specifically by means of continual voltage detection.

With a further advantageous embodiment of the invention, the protective device is designed to specify the voltage limit value and/or the gradient limit value as a function of at least one particular cell parameter of the battery cell. In doing so, the cell parameters of the battery cell, which are relevant for specifying such a voltage limit value and/or gradient limit value, may be defined in advance and stored, for example, in a memory of the protective device. Such cell parameters, however, may also be determined by the protective device itself. Cell parameters, the inclusion of which is advantageous when specifying the voltage limit value and/or the gradient limit value, for example, are the cell type and/or the cell chemistry of the battery cell. In other words, the gradient limit value and/or the voltage limit value may be specified as a function of whether the battery cell, for example, is a so-called power cell or an energy cell. For example, a power cell is designed to provide large quantities of energy within a short time, i.e. a very high level of electric power, which particularly is greater than the typical energy cells, while energy cells, in contrast, are designed for storing larger quantities of energy. These cell types are implemented, for example, by means of films of varying thickness within the galvanic element. Accordingly, voltage drops due to short-circuit have different levels of intensity with such different cell types. In a similar manner, the cell chemistry as such may also impact the voltage drops occurring with a particular short-circuit such that consideration of the respective cell chemistry of a respective battery cell is also advantageous. These properties, namely cell type and/or cell chemistry and/or further parameters such as capacitance, internal resistance, etc., may also themselves be determined by the protective device using corresponding measurements, particularly without any specifications. The protective device may correspondingly be configured, as a function of measurements carried out, to autonomously define threshold values for the voltage and/or the voltage gradients. To this end, the protective device may also comprise various further and other sensors, in addition to the preferred voltage sensor or the aforementioned current sensor.

With a further advantageous embodiment of the invention, the protective device is designed to detect a change in the at least one particular cell parameter and to modify the specified voltage value and/or the specified gradient limit value as a function of the detected change in the at least one particular cell parameter. In doing so, the cell parameter may also be a parameter that is different than the aforementioned cell parameters. This embodiment is above all especially advantageous when the cell parameter which impacts the characteristics of a voltage drop in the event of a short-circuit can change over the lifecycle of the battery cell and beyond. For example, the cell chemistry of the battery cell, particularly of the galvanic element, may change over the course of time and accordingly impact the voltage drop characteristics. Such a change may likewise be detected, for example, by the protective device, for example based on suitable measurements, and accordingly the limit values for the voltage and/or the voltage gradients are adapted accordingly. It is above all especially advantageous when the cell parameter in this case constitutes, for example, a degree of aging of the battery cell and/or a state of health of the battery cell. This can be determined based on methods already known from the prior art, particularly repeated over the course of time. Specifically the degree of aging of a battery cell in this case impacts the described voltage drop characteristics. Consideration of the degree of aging of the battery cell is thus especially advantageous when changing the aforementioned threshold values and/or their repeated or continued adaptation.

The size of the voltage limit values and/or gradient limit values can be determined by the protective device, for example based on a look-up table, a characteristic curve, or a predefined function, or the like. This type of function as well as such look-up tables may be stored in a memory of the protective device. For a respectively currently determined degree of aging of the battery cell, the voltage limit value and/or the gradient limit value, for example, can then be redefined based on such a look-up table. This also applies accordingly upon a change in the cell chemistry and/or during the initial determination of the cell type and a resulting specification of the aforementioned limit values. Thus, the most reliable detection possible of a short-circuit can also be ensured over the course of time and as the degree of aging of the battery cell increases. Moreover, several different cell parameters can also be considered simultaneously when specifying and/or changing the one or the two limit values.

Furthermore, the determination of voltage, particularly the size of the voltage change and/or the change in voltage over time does not have to occur particularly precisely, because the detection of tendencies is already sufficient, specifically in connection with short-circuit detection. In other words, during a short-circuit, such type of significant voltage change is caused such that, for example, even a greatly flawed estimate of the voltage change is still sufficient for detecting such a short-circuit very reliably. For example, such measurement errors may also be considered in a corresponding manner by specifying the respective limit values and/or threshold values. The aforementioned voltage limit value may be set higher, for example, by a definable safety buffer, and the aforementioned gradient limit value is accordingly lower by a definable safety buffer. If a short-circuit occurs, it is thus highly probable that, even upon voltage detection with very high degrees of uncertainty and/or measurement inaccuracies, based on the thusly selected threshold values, in which thus a corresponding safety buffer is considered, the short-circuit is also detected by the protective device and the described protective measure is implemented, namely the switch-off of the affected battery cell.

In an especially advantageous embodiment of the invention, the protective device is furthermore designed, in the event of the detected short-circuit, to provide information on the detection of the short-circuit to a prioritized control unit and/or to a second protective device, which comprises a second battery cell of the battery. It is above all especially advantageous in this case when other protective devices of other battery cells of the battery are also informed of a short-circuit detected by the protective device in question, because it is possible that such a short-circuit is only affecting a particular battery cell and cannot even be detected by protective devices of other battery cells. Such a special case could occur, for example, when several battery cells are situated in parallel configuration as likewise may be provided according to an embodiment of the invention, wherein, for example, several of such parallel configurations can be connected in series, wherein, however, not all battery cells have to be actively connected in a common parallel configuration and some may be inactive, for example in a particular operating mode, such as an ECO mode, in which, for example, the performance requirements are significantly lower. Such an actively connected cells are then decoupled, for example, from the other battery cells of the cell configuration via their at least one switching device, and a short-circuit in an active battery cell of the parallel configuration also would not be noticed by the inactively connected battery cells in such a situation, at least without further measures. Thus, by transferring the information on a short-circuit detected by one battery cell to other battery cells, a safety switch-off of other battery cells may also be carried out, even if they could not detect the short-circuit in question at all. The safety of the battery can hereby then be further increased. However, specifically such internal short-circuits may have grave consequences, because they may not necessarily be suppressed, for example, by the described switching devices. A possible consequence is, for example, a thermal runaway, i.e. a thermal runaway of a cell and/or of the cell chemistry starting at a certain temperature, which may lead to destruction of the cell and even fire in the worst-case scenario. By virtue of the fact that such a short-circuit can then be detected advantageously at least and especially a prioritized control device or other protective devices of other battery cells can be notified of this, overall safety measures can still advantageously be introduced, such as the switch-off as well of the other battery cells or a switch-off of the entire battery to prevent graver consequences. Activation or an increase in the cooling capacity for cooling the battery cells can also be introduced, for example, to avoid strong heating of the affected battery cell and a propagation of such heating via other battery cells and beyond and/or to counteract such heating. Specifically with short-circuits, primarily with those that cannot be suppressed close to the time of occurrence, very strong temperature increases may occur in a particular cell, which can then propagate accordingly. Due to the aforementioned measures, particularly due to the possibility of also detecting such a short-circuit, the safety of the battery can be increased enormously, particularly due to the prevention of propagation, i.e. preventing thermal participation of other cells that are thermally coupled to one another, and also due to the electric decoupling of the cells, which is caused by the opening of the at least one switching device.

Accordingly, a further advantageous embodiment of the invention is represented when the protective device is designed to receive information on the detection of a short-circuit from a second protective device, which comprises a second battery cell of the battery, and to switch off the battery cell upon receipt of the information. In a corresponding manner, the protective device may also switch off the battery cell, i.e. isolate the energy storage unit of the battery cell from at least one of the cell terminals by means of the at least one protective device, even if no short-circuit has been detected by the protective device itself but instead, for example, only by a neighboring battery cell and/or the protective device thereof.

Furthermore, the invention also relates to a battery, particularly a high-voltage battery, which has a battery cell comprising a protective device according to the invention or one of its embodiments. Preferably, the battery in this case comprises several battery cells, each of which may comprise such a protective device. In particular, all battery cells of the battery may be designed as the previously described intelligent battery cell. In doing so, the several battery cells may be arranged with respect to one another in any combination comprising series and/or parallel connection. For example, the battery may have several cell groups, wherein a respective cell group has several battery cells connected in parallel. The cell groups themselves may be connected to one another in series. An especially powerful high-voltage battery, for example, can thereby be provided.

Furthermore, the invention also relates to a motor vehicle with a battery according to the invention or one of its embodiments.

The advantages described for the protective device according to the invention and its embodiments apply in a similar manner to the battery according to the invention and the motor vehicle according to the invention.

The vehicle according to the invention is preferably designed as a motor vehicle, particularly as a passenger car or commercial vehicle, or as a passenger bus or motorcycle. Moreover, the motor vehicle according to the invention preferably constitutes an electric and/or hybrid vehicle.

Moreover, the protective device according to the invention and its embodiments and the battery according to the invention may not only be used in a motor vehicle but also in stationary energy storage devices, in which accordingly the same safety advantages can be achieved.

Furthermore, the invention also relates to a method for switching off a battery cell of a battery of a motor vehicle in the event of an electrical short-circuit, wherein the battery cell has two cell terminals and an energy storage unit for storing energy, wherein the energy storage unit is connected to the cell terminals in an electrically conductive manner, at least in a particular operating state of the battery cell, in order to provide cell voltage to the cell terminals, and wherein the short-circuit is detected as a function of at least the cell voltage affecting the battery cell. In doing so, the battery cell has at least one protective device, which is arranged between the energy storage unit and at least one of the cell terminals, wherein the energy storage unit is isolated from the at least one of the cell terminals by means of the switching device in order to switch off the battery cell.

The advantages described in reference to the protective device according to the invention and the embodiments thereof apply in a similar manner to the method according to the invention.

The invention also includes refinements of the method according to the invention, which have features as they have already been described in association with the refinements of the protective device according to the invention. For this reason, the corresponding refinements of the method according to the invention are not described again here.

The invention also comprises the combinations of the features of the described embodiments.

BRIEF DESCRIPTION OF THE DRAWINGS

Exemplary embodiments of the invention are described in the following. The following is shown.

DETAILED DESCRIPTION

The exemplary embodiments explained in the following refer to preferred embodiments of the invention. With the exemplary embodiments, the described components of the embodiments represent individual features to be considered independently of one another, which also further embody the invention independently of one another. Thus, the disclosure should also comprise combinations of the features of the embodiments other than those shown. Furthermore, the described embodiments can also be supplemented through further described features of the invention.

The same reference numerals refer to equivalent features and functions in the figures.

Figure 1:
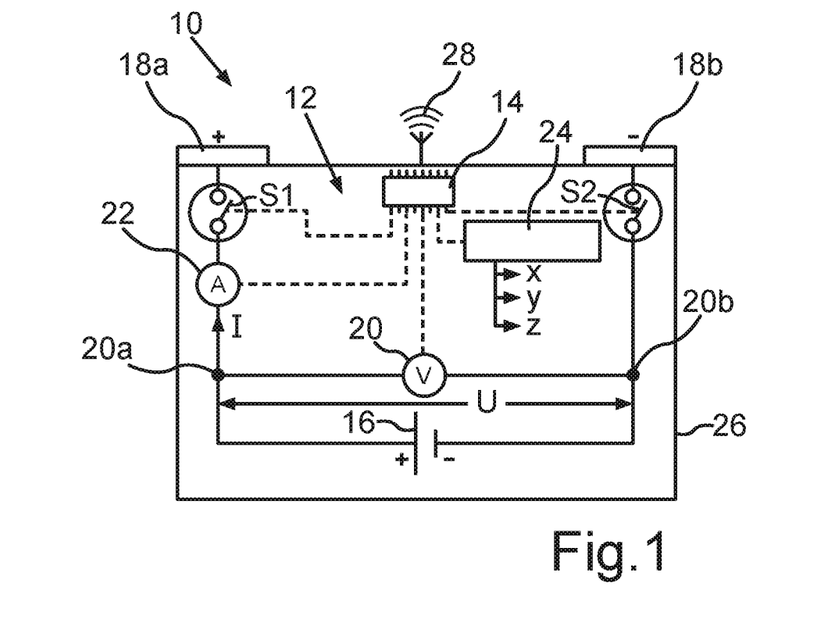
FIG. 1 a schematic representation of an intelligent battery cell with a protective device according to an exemplary embodiment of the invention.

FIG. 1 shows a schematic representation of an intelligent battery cell 10 with a protective device 12 for switching off the battery cell 10 according to an exemplary embodiment of the invention. The protective device 12 in this case is designed to detect an electrical short-circuit and to switch off the battery cell 10 when such a short-circuit is detected. The protective device 12 in this case comprises, on the one hand, a control unit 14, which may be designed, for example, as a microcontroller or as an analog circuit. Furthermore, the battery cell 10 comprises a galvanic element 16 as well as two cell terminals 18*a*, 18*b*, of which cell terminal 18*a* constitutes a positive terminal and cell terminal 18*b* constitutes a negative terminal of the battery cell 10. Furthermore, the battery cell 10 in this example has two switches S1, S2, which are arranged between the galvanic element 16 and the respective cell terminals 18*a*, 18*b*. These two switches S1, S2 may be designed, for example, as electronically controllable switches, particularly circuit breakers, and additionally can be actuated by the control unit 14 of the protective device 12. Essentially however, only one of the two switches S1 or S2 is sufficient. In other words, according to a further variant, the battery cell 10 may only have the first switch S1 but not the second switch S2 and, in a second variant, the battery cell 10 may only have the second switch S1 but not the first switch S1. Furthermore, the protective device may comprise also one or more sensors. In the following example, the protective device 12, as part of the battery cell 10, comprises a voltage sensor 20, which is connected to the galvanic element 16 in parallel and also to the respective cell terminals 18*a*, 18*b* in parallel, and is designed to detect information about the galvanic element 16, which is an example of an energy storage unit here. Furthermore, the taps 20*a*, 20*b* of the voltage sensor 20 are arranged between the galvanic element 16 and the respective switches S1, S2, at least in the event that both switches S1 and S2 are present. Otherwise, only one of the two taps 20*a*, 20*b* is arranged between the galvanic element 16 and the single switch S1 or S2, and the other of the two taps 20*a*, 20*b* is then arranged at any place between the galvanic element 16 and the particular cell terminal 18*a* or 18*b*. Thus, a voltage U dropping via the galvanic element 16 can also be detected when one or both switches S1, S2 are open.

Additionally or alternatively, the protective device 12 may also have a current sensor 22 to detect a cell current I. Based on the detected cell current I, the voltage U dropping via the galvanic element 16 can likewise be determined or estimated. Within the scope of the present invention, it is preferred, however, for short-circuit detection to occur based on the voltage value U detected by the voltage sensor 20. Furthermore, the battery cell 10 may have still further sensors 24, which are illustrated here only as x, y, z as an example. By means of such further sensors, the pressure within the battery cell 10, for example, may be detected and/or an isolation error of the battery cell 10 and/or an electrolyte analysis can be carried out, on the basis of which, for example, changes in the cell chemistry can also be determined.

Furthermore, the described components, particularly also including the two cell terminals 18*a*, 18*b*, are arranged within a cell housing 26 of the battery cell 10. Furthermore, the control unit 14 is designed for communication with a prioritized control device and/or for communication with other control units 14, which are assigned to other battery cells 10. This communication option is illustrated by the reference numeral 28 in FIG. 1.

On the one hand, the invention utilizes the knowledge that a short-circuit and/or a strong current flow is expressed in a significant voltage drop in the cell voltage U of the battery cell 10 and/or the galvanic element 16 thereof. Such a short-circuit can advantageously thereby be detected in an especially simple and economical manner by means of only one voltage measurement of the voltage U, particularly by means of the voltage sensor 20. Short-circuit detection at the cell level has numerous advantages. Particularly, cell-internal short-circuits, which may occur, for example, also within the galvanic element 16, can also hereby be detected, which is not necessarily expressed when assessing the properties at the module level or the overall battery level, for example when the affected battery cell 10 is in a parallel configuration with other battery cells 10, but the other battery cells 10 are not actively connected due to a certain operating mode. External short-circuits, on the other hand, can be simultaneously detected by several of such intelligent battery cells 10, which is significantly safer for short-circuit detection due to its redundancy. In addition, the result of a detected short-circuit of a battery cell 10 can also be communicated immediately to neighboring cells 10 or to a prioritized control device. A neighboring cell 10 in this case may constitute, for example, a cell 10 situated in the same parallel configuration and/or also a further battery cell 10 connected to the battery cell 10 in series. The short-circuit may also be communicated, however, to any other battery cell 10 regardless of whether it is a neighboring cell 10 or not. Even if other battery cells 10 do not detect such a short-circuit for any sort of reason, for example because they are currently deactivated because they are currently not being used, these battery cells 10 can likewise introduce corresponding measures, particularly safety measures, such as a switch-off of the battery cells 10, particularly a long-term switch-off at least until the defect is eliminated.

An especially great advantage primarily exists in that a switch-off of the affected battery cell 10 thereby takes place in that the control unit 14 actuates and correspondingly opens at least one of the two switches S1, S2, depending on whether the battery cell has only one switch S1 or S2 or both switches S1 and S2, such that the galvanic element 16 is decoupled at least from one of the cell terminals 18a, 18b. An especially high degree of safety can thereby be provided in that both switches S1, S2 are open, at least when the battery cell 10 has both switches S1 and S2. Because the two switches S1, S2, as previously mentioned, may be designed as electronically controllable switches, an especially quick current switch-off is thus enabled such that high current flows caused by a short-circuit can be more quickly limited or suppressed, and thus possible damage to the battery cell 10 can be counteracted significantly more quickly and/or such damage can be prevented from the outset. This also applies accordingly when only one of the two switches S1 or S2 is provided. Damage to other battery cells 10 may also be counteracted, because the result of a short-circuit can be communicated also very quickly to the prioritized control device and/or the other battery cells 10.

Figure 2:
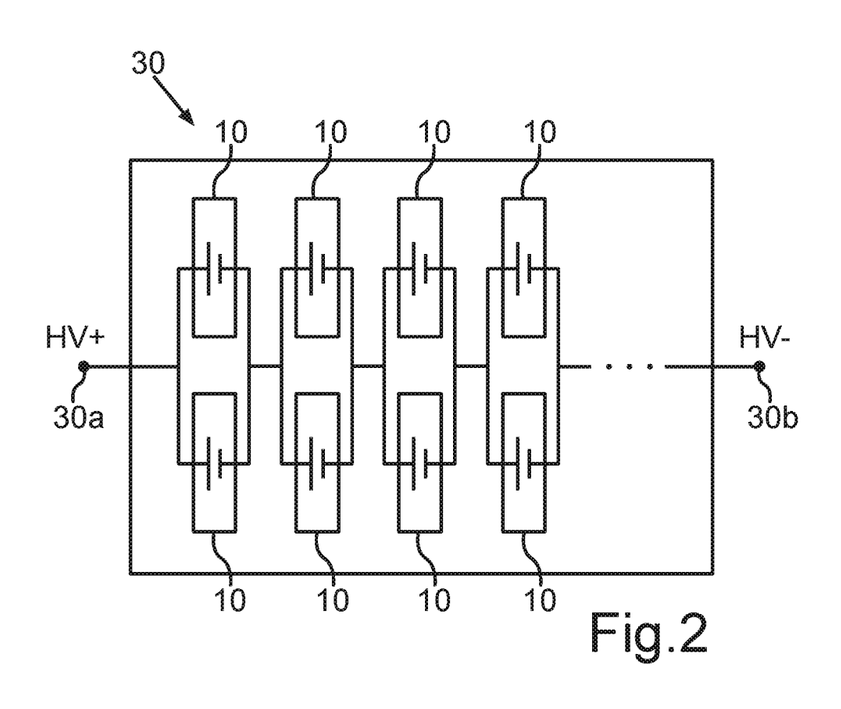
FIG. 2 a schematic representation of a motor vehicle battery with several intelligent battery cells according to an exemplary embodiment of the invention.

FIG. 2 shows a schematic representation of an example of a battery 30, particularly a high-voltage battery for an electric vehicle, which has several of the battery cells 10, which may be designed as described in FIG. 1. These battery cells 10 are in a series connection, for example, comprising several parallel circuits of these battery cells 10. In particular, every two battery cells 10 are connected in parallel as an example in this case, and the cell groups, in turn, are connected in series. Accordingly, a positive high-voltage potential HV+ and a negative high-voltage potential HV− are then provided at the cell terminals 30a, 30b of the high-voltage battery 30. In general, such a high-voltage battery 30 may have any combinations of parallel and/or series connections comprising the described battery cells 10, particularly also only a pure series connection or a pure parallel connection, depending on the application.

Figure 3:
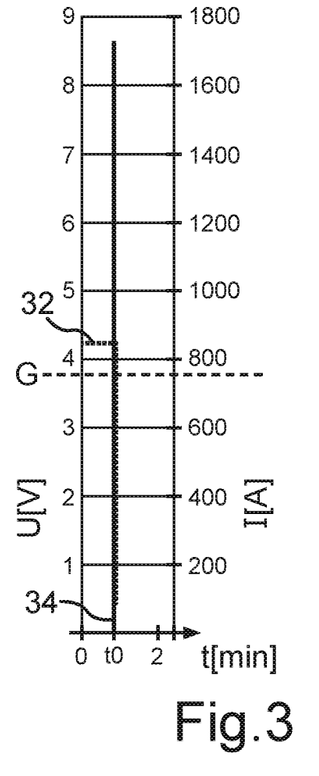
FIG. 3 a schematic representation of a diagram to illustrate a voltage drop of a conventional battery cell caused by a short-circuit with low short-circuit resistance.

FIG. 3 shows a schematic representation of a diagram to illustrate the voltage drop of a conventional battery cell in the event of a short-circuit with very low short-circuit resistance, particularly with a short-circuit resistance of 1 milliohm. In this case, the diagram illustrates the curve of the cell voltage 32 as well as the short-circuit current 34 over time. The time t in this case is indicated in minutes, the voltage U in volts, and the current strength I in amps. The short-circuit in this case occurs at point in time t0, which causes an abrupt current flow 34, particularly in the form of a current peak, which leads to a drop in the curve of the cell voltage 32 over time, particularly the open-circuit voltage of the battery cell. Using this voltage drop in the curve of the cell voltage 32 over time, such a short-circuit can be simply and reliably detected, which can be used accordingly with a corresponding design of a battery cell 10 with a protective device according to an exemplary embodiment of the invention.

Figure 4:
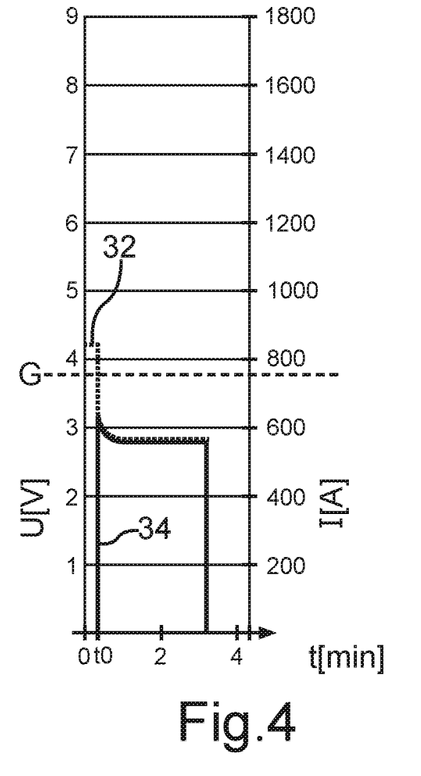
FIG. 4 a schematic representation of a diagram to illustrate a voltage drop of a conventional battery cell caused by a short-circuit with medium short-circuit resistance.

FIG. 4 in this case shows a further example of a curve of the cell voltage 32 of a conventional battery cell over time in the event of a short-circuit with medium short-circuit resistance, particularly a short-circuit resistance of 5 milliohms. The short-circuit again starts at point in time t0 here, which leads to an abrupt increase in the current flow 34 through the battery cell. In turn, this results in a voltage drop in the curve of the cell voltage 32 over time, which represents, in this case, particularly the open-circuit voltage of the battery cell. In contrast with the example from FIG. 3, this short-circuit is suppressed significantly later according to FIG. 4 to illustrate the further curve of the cell voltage 32 and of the short-circuit current 34 over time, which would remain approximately constant during the short-circuit. Within the scope of the present invention, a significantly faster interruption of such a short-circuit occurs, however, at least when it is an external short-circuit, particularly in the microsecond to millisecond range, such as is explained in greater detail by means of FIG. 6.

Figure 5:
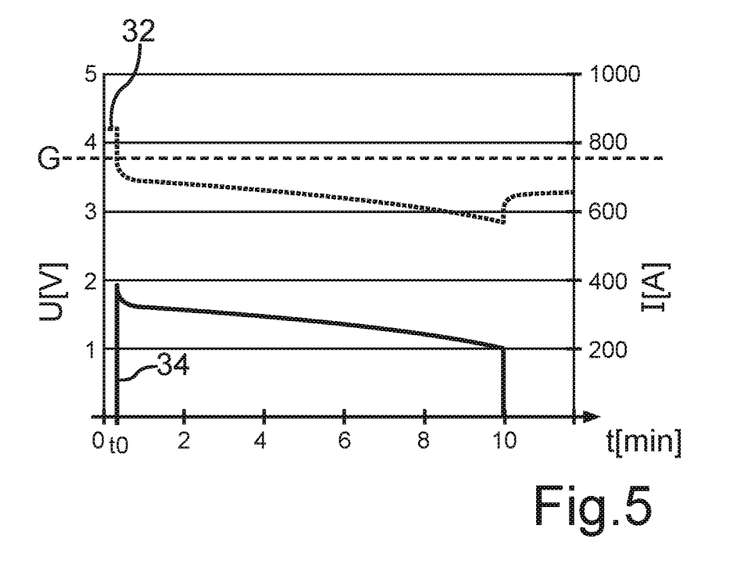
FIG. 5 a schematic representation of a diagram to illustrate a voltage drop of a conventional battery cell caused by a short-circuit with high short-circuit resistance, battery cells.

FIG. 5 illustrates a further example of the curve of the cell voltage 32 of a conventional battery cell over time in the event of a short-circuit with high short-circuit resistance, particularly 10 milliohms in this example, as well as, in turn, the curve of the short-circuit current 34 over time, wherein the short-circuit again occurs at point in time t0 here and likewise is not suppressed immediately but only in about 10 minutes. This also shows that an abrupt current increase 34 in the event of a short-circuit causes a voltage drop in the curve of the cell voltage 32 and/or the open-circuit voltage of a conventional battery cell over time, which then can be used with a battery cell 10 according to an exemplary embodiment of the invention in order to detect such a short-circuit.

Figure 6:
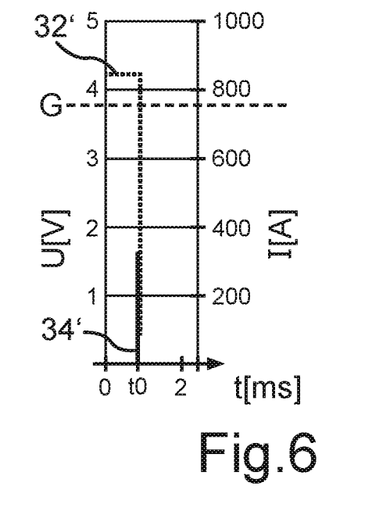
FIG. 6 a schematic representation of a diagram to illustrate a voltage drop caused by a short-circuit with low short-circuit resistance with a battery cell having a protective device according to an exemplary embodiment of the invention.

In particular, the curve of the cell voltage 32 over time for detecting a short-circuit in this case can be compared with a limit value G, which is indicated by a horizontal dashed line in FIG. 3, FIG. 4, FIG. 5, and particularly also in FIG. 6. As can be seen, a suitable limit value G, by means of which a short-circuit can be reliably detected in all of these cases, can be defined by such a limit value G in all of these cases, i.e. from very low short-circuit resistances to very high short-circuit resistances. Alternatively or additionally, the change in the voltage curve 32 over time can be compared with a definable threshold value. As can be seen in all of these figures, namely FIG. 3, FIG. 4, and FIG. 5, the voltage change over time is so great such that a short-circuit can be detected even more reliably based on this. In doing so, respective conditions can be linked to both the amount of the voltage drop as well as the size of the change in the voltage curve 32 over time, particularly in the form of definable threshold values, in order to detect the short-circuit. Accordingly, such a short-circuit can then be considered detected when both of these criteria are fulfilled, i.e. when the voltage U drops to below a specified limit value G, as well as also when the change in the voltage curve 32 over time falls below a further gradient limit value.

To this end, FIG. 6 shows a schematic representation of a diagram to illustrate a voltage drop, caused by a short-circuit, of the cell voltage 32' over time as well as, in turn, the curve of the short-circuit current 34' over time with low short-circuit resistance with a battery cell 10 having a protective device 12 according to an exemplary embodiment of the invention. The short-circuit, in turn, also occurs here at point in time to. Due to the protective device 12, this short-circuit is then detected as soon as the voltage U and/or its curve 34' over time drops below the specified voltage limit value G. In contrast with the previous examples, the short-circuit can thus be interrupted within the millisecond range or even faster, particularly by opening a switch S1 or S2 or both switches S1 and S2. Consequently, the short-circuit current in this example cannot achieve such a high maximum value, as in FIG. 3 for example. In particular, the voltage limit value G and/or the gradient limit value is to be measured such that it is ensured that the maximum short-circuit current always remains below a defined threshold, for example 400 A, as is also the case in this example.

Thus, a short-circuit or at least a strong and potentially damaging current flow can be detected in an especially simple and reliable manner by means of voltage detection and/or detection of a voltage drop. Such a voltage drop can consequently open one or more switches S1, S2 of the battery cell 10 and particularly in the shortest time, particularly in the microsecond range to millisecond range, such that the short-circuit current can be suppressed or so quickly that such a high current flow cannot even occur which could potentially damage or even destroy the battery cell 10. Such a detected event can furthermore be immediately communicated to neighboring cells, other cells in general, or to a prioritized control device.

As a whole, the examples show how short-circuit detection through the invention can be provided by means of voltage drop detection with smart cells, which constitutes a very economical implementation variant, because only one voltage measurement is necessary, a very fast short-circuit detection and consequently a very fast current shut-off is enabled, and especially simply can be implemented as an auxiliary function with overall smart cell designs, because essentially no additional hardware components, such as switches or sensors, are required when they are easily available in such intelligent battery cells, which additionally enable clear differentiation between a short-circuit and, for example, a boost or an acceleration, which can increase safety enormously, by means of which a prevention of short-circuits and undesirable strong battery cell loads is enabled, and which additionally enables threshold values and/or parameters for short-circuit detection to be made programmable and easily definable and which alternatively also enables simple implementation by means of an analog circuit.

The invention claimed is:

1. A protective device for switching off a battery cell of a battery of a motor vehicle during an electrical short-circuit, comprising:

the battery cell has two cell terminals and an energy storage unit for storing energy;

the energy storage unit is connected to the cell terminals in an electrically conductive manner in a certain operating state of the battery cell in order to provide a cell voltage to the cell terminals; and wherein the short-circuit is detected as a function of at least the cell voltage affecting the battery cell, wherein the battery cell includes the protective device and at least one switching device, which is arranged between the energy storage unit and at least one of the cell terminals, wherein the protective device is designed to isolate the energy storage unit from at least one of the cell terminals in order to switch off the battery cell by the switching device.

2. The protective device according to claim 1, wherein the protective device for detecting the short-circuit is designed to detect the cell voltage affecting the battery cell as a voltage dropping via the energy storage unit, wherein the protective device has a voltage sensor, which is connected to the cell terminals in parallel and to the energy storage unit in parallel, in order to detect the cell voltage.

3. The protective device according to claim 1, wherein the protective device is designed to detect the short-circuit under at least one condition that the detected cell voltage fails to meet a minimum voltage limit value and/or that a detected change in the cell voltage over time exceeds a gradient limit value.

4. The protective device according to claim 3, wherein the protective device is designed to specify the minimum voltage limit value and/or the gradient limit value as a function of at least one cell parameter of the battery cell.

5. The protective device according to claim 4, wherein the protective device is designed to detect a change in the at least one cell parameter and to modify the minimum voltage limit value and/or the gradient limit value as a function of the detected change in the at least one cell parameter.

6. The protective device according to claim 1, wherein the protective device is designed, during the short-circuit, to provide information on the short-circuit to a prioritized control unit and/or to a second protective device, which includes a second battery cell of the battery.

7. The protective device according to claim 1, wherein the protective device is designed to receive information on the detection of a short-circuit from a second protective device, which includes a second battery cell of the battery, and to switch off the battery cell upon receipt of the information.

8. A battery for a motor vehicle, comprising:

a battery cell, which includes a protective device, the protective device for switching off a battery cell of a battery of a motor vehicle during an electrical short-circuit, comprising:

the battery cell has two cell terminals and an energy storage unit for storing energy;

the energy storage unit is connected to the cell terminals in an electrically conductive manner in a certain operating state of the battery cell in order to provide a cell voltage to the cell terminals; and the protective device is designed to detect the short-circuit as a function of at least the cell voltage affecting the battery cell, wherein the battery cell includes the protective device and at least one switching device, which is arranged between the energy storage unit and at least one of the cell terminals, wherein the protective device is designed to isolate the energy storage unit from at least one of the cell terminals in order to switch off the battery cell by the switching device.

9. A method for switching off a battery cell of a battery of a motor vehicle during an electrical short-circuit, comprising:
   providing two cell terminals and an energy storage unit for storing energy;
   connecting the energy storage unit to the cell terminals in an electrically conductive manner in a certain operating state of the battery cell in order to provide cell voltage to the cell terminals; and
   detecting the short-circuit as a function of at least the cell voltage affecting the battery cell,
wherein
the battery cell has at least one switching device, which is arranged between the energy storage unit and at least one of the cell terminals, wherein the energy storage unit is isolated from the at least one of the cell terminals by means of the switching device in order to switch off the battery cell.

* * * * *